United States Patent
Madar et al.

(10) Patent No.: US 12,035,495 B1
(45) Date of Patent: Jul. 9, 2024

(54) BOARD PHYSICAL PLACEMENT VERIFICATION IN A SERVER CHASSIS

(71) Applicant: Amazon Technologies, Inc., Seattle, WA (US)

(72) Inventors: Shay Madar, Biet Rimon (IL); Yotam Admon, Tsur Hadasa (IL); Ali Elashri, Seattle, WA (US); Ziv Harel, Megido (IL); Nafea Bshara, Cupertino, CA (US); Noam Navon, Tirat Carmel (IL)

(73) Assignee: Amazon Technologies, Inc., Seattle, WA (US)

( * ) Notice: Subject to any disclaimer, the term of this patent is extended or adjusted under 35 U.S.C. 154(b) by 131 days.

(21) Appl. No.: 17/361,031

(22) Filed: Jun. 28, 2021

(51) Int. Cl.
*H05K 5/02* (2006.01)
*G01R 33/02* (2006.01)
*H05K 5/00* (2006.01)

(52) U.S. Cl.
CPC ........... *H05K 5/0247* (2013.01); *G01R 33/02* (2013.01); *H05K 5/0065* (2013.01)

(58) Field of Classification Search
CPC .. H05K 5/0247; H05K 5/0065; H05K 1/0266; H05K 1/0268; G01R 33/02; G01R 31/2813
See application file for complete search history.

(56) References Cited

U.S. PATENT DOCUMENTS

| | | | | |
|---|---|---|---|---|
| 5,813,876 A | * | 9/1998 | Rutigliano | G01R 31/2808 439/260 |
| 6,105,090 A | * | 8/2000 | Fosmo | G06F 1/266 713/340 |
| 2012/0195548 A1 | * | 8/2012 | Brunner | H05K 1/14 385/16 |
| 2016/0147699 A1 | | 5/2016 | Hartman | |

OTHER PUBLICATIONS

Dwight Pavlovic, "What are PCIe Slots and How Can I Use Them in My PC?", dated Aug. 17, 2020, pp. 1-9.

* cited by examiner

*Primary Examiner* — James Wu
(74) *Attorney, Agent, or Firm* — Alexander A. Knapp; Kowert, Hood, Munyon, Rankin & Goetzel, P.C.

(57) ABSTRACT

A computer system includes a chassis comprising location indicating elements, such as springs, magnets, standoffs, or other types of location indicating elements physically attached to the chassis in a configuration that indicates locations in the chassis. Also, the computer system includes multiple printed circuit boards comprising pads configured to interface with the location indicating elements, wherein combinations of sensed or not sensed location indicating elements at the pads of the printed circuit boards provide a physically verified placement location for the printed circuit boards.

20 Claims, 12 Drawing Sheets

BOARD PHYSICAL PLACEMENT VERIFICATION IN A SERVER CHASSIS

BACKGROUND

Some computer systems include multiple printed circuit boards, such as motherboards or other special purpose boards. The printed circuit boards are mounted in a chassis of the computer system at different locations in the chassis.

Some such computer systems assign logical IDs, functions, and/or addresses, such as PCIe addresses, to the printed circuit boards based on connections between the printed circuit boards and a controller for the computer system, such as a baseboard management controller, or other controller. For example, a controller for a computer system including multiple printed circuit boards may associate a first printed circuit board connected to a first controller port as being located in a first position in a chassis of the computer system, a second printed circuit board connected to a second controller port as being located in a second position in the chassis, and so on.

Figure 1:
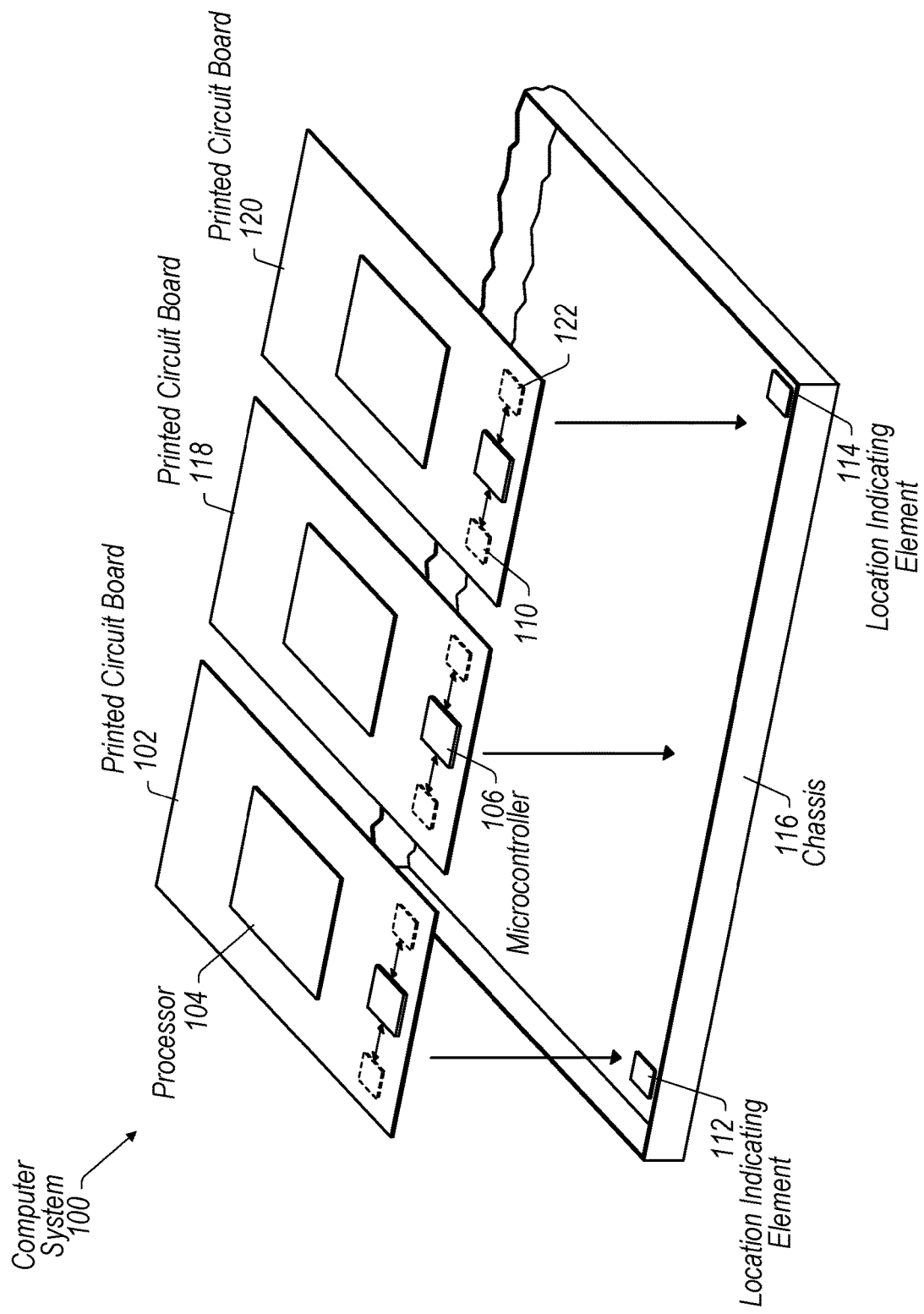
FIG. 1 is an exploded view of a cut away portion of an interior of a computing system chassis illustrating printed circuit boards being installed in the chassis at different mounting locations, wherein the different mounting locations comprise location indicating elements coupled to the chassis that interface with pads of the printed circuit boards to indicate respective physical placement locations of the respective printed circuit boards when mounted in the chassis, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments include a computer system chassis with location indicating elements coupled to the computer system chassis at different mounting locations for mounting printed circuit boards (PCBs) in the computer system chassis. The printed circuit boards include pads on a bottom side of the PCBs that are configured to detect a presence or an absence of a location indicating element adjacent to the pad when the PCB comprising the pads is mounted in the computer system chassis. The PCBs also include a microcontroller coupled with the pads, wherein a determination of a presence or an absence of a location identifying element for a given pad is performed by the microcontroller using signals sensed by the pads.

For example, in some embodiments, the location indicating elements are connected to ground via the computer system chassis and the pads of the PCB are provided a slight voltage (e.g. ~3 volts), wherein the microcontroller determines a presence or an absence of a ground connection at the respective pads based on the voltage being retained or grounded, wherein a pad connected to a location indicating element coupled to ground will indicate a ground state to the microcontroller and another pad that is not connected to a location indicating element will retain its slight voltage, thus indicating a lack of a ground connection.

In some embodiments, multiple such pads are included on a bottom side of a PCB, such as a left side and a right side. Additionally, multiple location indicating elements are coupled at different locations in a computer system chassis. For example, in some embodiments, a location indicating element coupled to ground may be located in a left half of a mounting location for a mounting location on a left side of the chassis and another location indicating element coupled to ground may be located in a right half of a mounting location for another mounting location on a right side of the chassis. In such an example, a center mounting location may not include any location indicating elements coupled to ground. Additionally, in such an example, each printed circuit board may include a left side pad and a right side pad. Thus, a given one of the printed circuit boards mounted in the mounting location on the left side of the chassis will interface with the location indicating element in the left half of the left side mounting location via the left side pad of the printed circuit board. Likewise another printed circuit board mounted in the mounting location on the right side of the chassis will interface with the location indicating element in the right half of the right side mounting location via the right side pad of the other printed circuit board. Also, in such an example a printed circuit board mounted in the mounting location in the center of the chassis may not interface with any location indicating element. Thus, the microcontroller for a given one of the printed circuit boards may determine a first signal, such as (1, 0), for the given printed circuit board when mounted in the left side mounting location, but if the same given printed circuit board were to be mounted in the right side mounting location, the microcontroller may determine a second signal, such as (0,1), or if the same given printed circuit board were to be mounted in the center mounting location the microcontroller may determine a third signal, such as (0,0). In some embodiments, the microcontrollers of the respective printed circuit boards mounted in the computer system chassis may provide such determined signals to a management controller of the computer system to indicate physical placement locations in the chassis for the respective printed circuit boards.

For example, some computer systems assign an address and/or ID and/or functionality ("system setup") to each printed circuit board (sub-element). When the connection between the central control function (which is allocating the ID/Address/function) to the sub-elements is flexible (e.g.

connected through cables) this results with a challenge of making the system-setup deterministic and known (e.g. when using identical sub-elements where each has a different function). This may result with user experience variation (location of functions on front panel) as well as testing/ repair challenges (repair the right sub-element).

It is noted that some computer systems may determine locations of printed circuit boards in a chassis based on ports of a controller to which the respective printed circuit boards are coupled. For example, the printed circuit boards may be coupled to the ports of a management controller using cables or other coupling mechanisms. However, in such systems, the printed circuit boards may be connected to the controller ports out of order. For example a cable connected at a first end to a printed circuit board located in a first position may be connected to a controller port associated with a second position and another printed circuit board located in a second position may be connected to a controller port associated with the first position, as an example. However, physical placement verification using location indicating elements coupled to a server chassis, as described herein, overcome such issues of miss-matched couplings because the location indicating elements are physically mounted to the server chassis in a fixed manner such that human error, such as miss-matching cables, is not possible.

In some embodiments, such position signals determined by the microcontrollers of the respective printed circuit boards may be used by a management controller of a computer system to assign particular roles or tasks to the different printed circuit boards based on respective placement locations. For example, in some embodiments, high workload roles or tasks that result in high amounts of generated waste heat may be assigned to non-adjacent printed circuit boards.

As another example, a management controller may provide an indication of a failed printed circuit board, such as for use by a technician in repairing the computer system. However, in systems that rely on ports and cabling to determine printed circuit board locations, a miss-matched cabling may result in an incorrect printed circuit board being replaced based on a false position indication provided by the management controller. In contrast, when physical location verification is implemented, as described herein, using location indicating elements physically coupled at fixed locations in the chassis, such miss-match errors are reduced or eliminated. This reduces the chances of an incorrect printed circuit board being replaced.

In some embodiments, the printed circuit boards may be motherboards comprising central processing units, or may be other types of printed circuit boards comprising other types of processors, such as graphics processing units (GPUs), field programmable gate arrays (FGPAs), application specific integrated circuits (ASICs), networking cards, etc.

In some embodiments, a microcontroller of a printed circuit board may additionally, or alternatively, indicate a position (e.g. left, center, right, etc.) in addition to or instead of indicating a signal comprising a combination of sensed pad readings (e.g. 10, 00, 01, etc.).

In some embodiments, printed circuit boards may include various numbers of pads, such as two pads as described in the example above. Or in some embodiments, the printed circuit boards may include a greater number of pads, such as three pads, four pads, etc. Also, in some embodiments, the pads may be located at different locations on the printed circuit boards, such as a left half and a right half in the example above, or such as a top half and bottom half. In embodiments with more than two pads the pads may be located on a left side, center, and right side; or may be located on an upper side, lower side and center. Additionally, in some embodiments pads may be located, for example, in each corner of the printed circuit boards. In some embodiments, various numbers of position locations may be indicated using signals comprising a combination of sensed pad readings. For example, in embodiments with three pads, a position within a row (e.g. column position), such as center, left, and right may be indicated with two of the pads, such as a left pad and right pad, as discussed above, and a row position (e.g. upper row, lower row) may be indicated with a center pad. For example, positions in a lower row may be indicated with signals such as 100, 000, 001, and positions in an upper row may be indicated with signals such as 110, 010, 011. In embodiments with four or more pads, an even larger number of positions such as more positions within a row or more rows may be indicated.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, a heat exchanger, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server.

As used herein, "data center" includes any facility or portion of a facility in which computer operations are carried out. A data center may include rack-mounted servers dedicated to specific functions or serving multiple functions. Examples of computer operations include information processing, communications, testing, simulations, power distribution and control, and operational control. Computer systems as described herein may be mounted in racks included in a data center in some embodiments.

FIG. 1 is an exploded view of a cut away portion of an interior of a computing system chassis illustrating printed circuit boards being installed in the chassis at different mounting locations, wherein the different mounting locations comprise location indicating elements coupled to the chassis that interface with pads of the printed circuit boards to indicate respective physical placement locations of the respective printed circuit boards when mounted in the chassis, according to some embodiments.

Computing system 100 includes chassis 116 and location indicating elements 112 and 114 coupled to chassis 116. Also, computer system 100 includes printed circuit boards 102, 118, and 120. Each of printed circuit boards 102, 118, and 120 include a processor 104, such as a CPU, GPU, ASIC, FPGA, etc. and a microcontroller 106. Also, each of printed circuit boards 102, 118, and 120 include a left pad 110 and a right pad 122.

As can be seen in FIG. 1, when printed circuit board 102 is mounted in the left side mounting location of chassis 116, the left pad 110 of printed circuit board 102 will interface with the left side location indicating element 112. Thus, providing a physically verified location of printed circuit board 102 as being mounted in the left side mounting location of chassis 116. Likewise, when printed circuit board 120 is mounted in the right side mounting location of chassis 116, the right pad 122 of printed circuit board 120 will interface with the right side location indicating element 114. Thus, providing a physically verified location of printed circuit board 120 as being mounted in the right side mounting location of chassis 116. Additionally, when the printed circuit board 118 is mounted in the center location of chassis 116 the left and right side pads (110 and 122) of printed circuit board 118 will not interface with any location indicating elements. Thus, providing a physically verified location of printed circuit board 118 as being mounted in the center mounting location of chassis 116.

Figure 4:
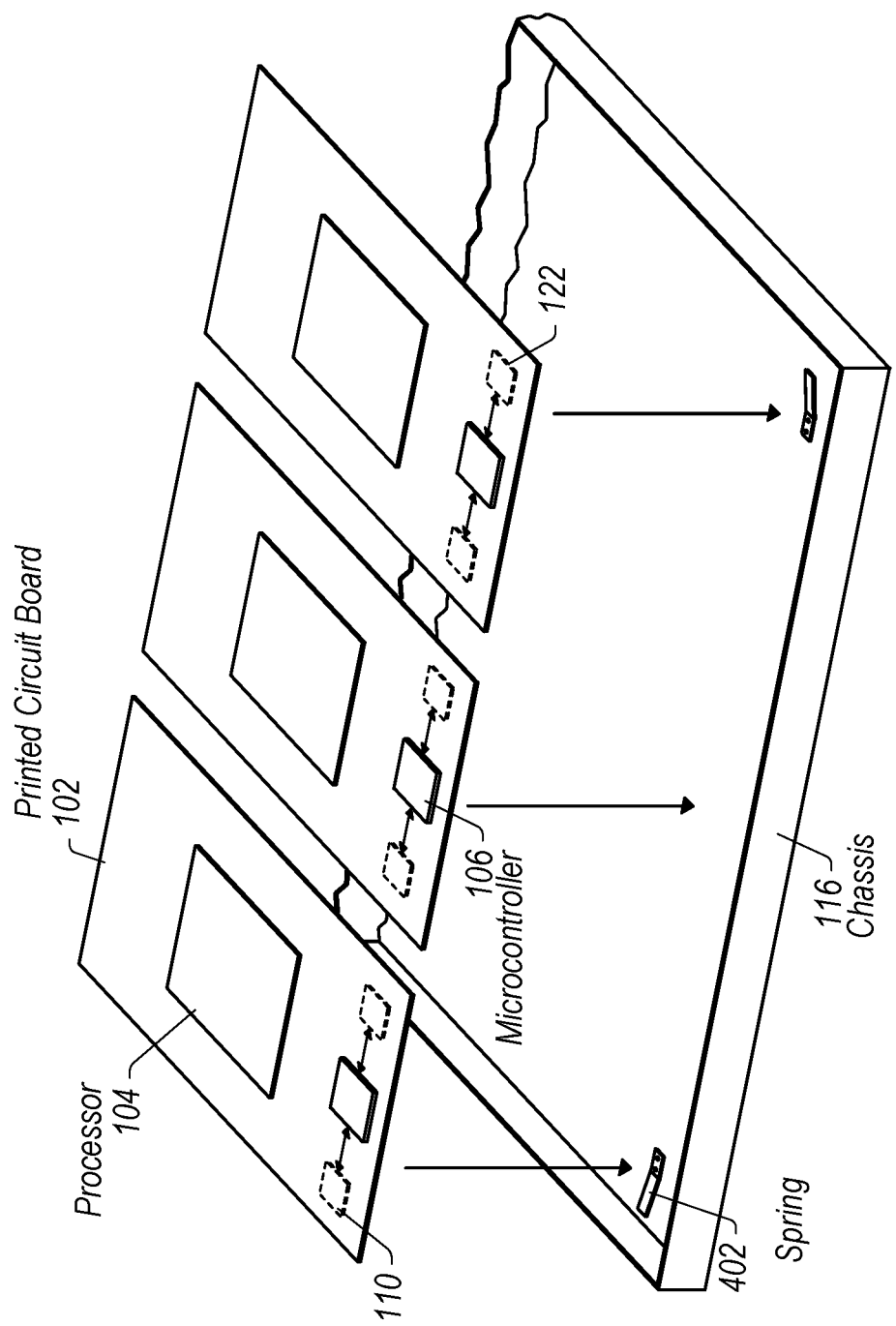
FIG. 4 is an exploded view of a cut away portion of an interior of a computing system chassis illustrating printed circuit boards being installed in the chassis at different mounting locations, wherein the different mounting locations comprise conductive spring elements coupled to the chassis that interface with pads of the printed circuit boards to indicate respective physical placement locations of the respective printed circuit boards when mounted in the chassis, according to some embodiments.
Figure 5:
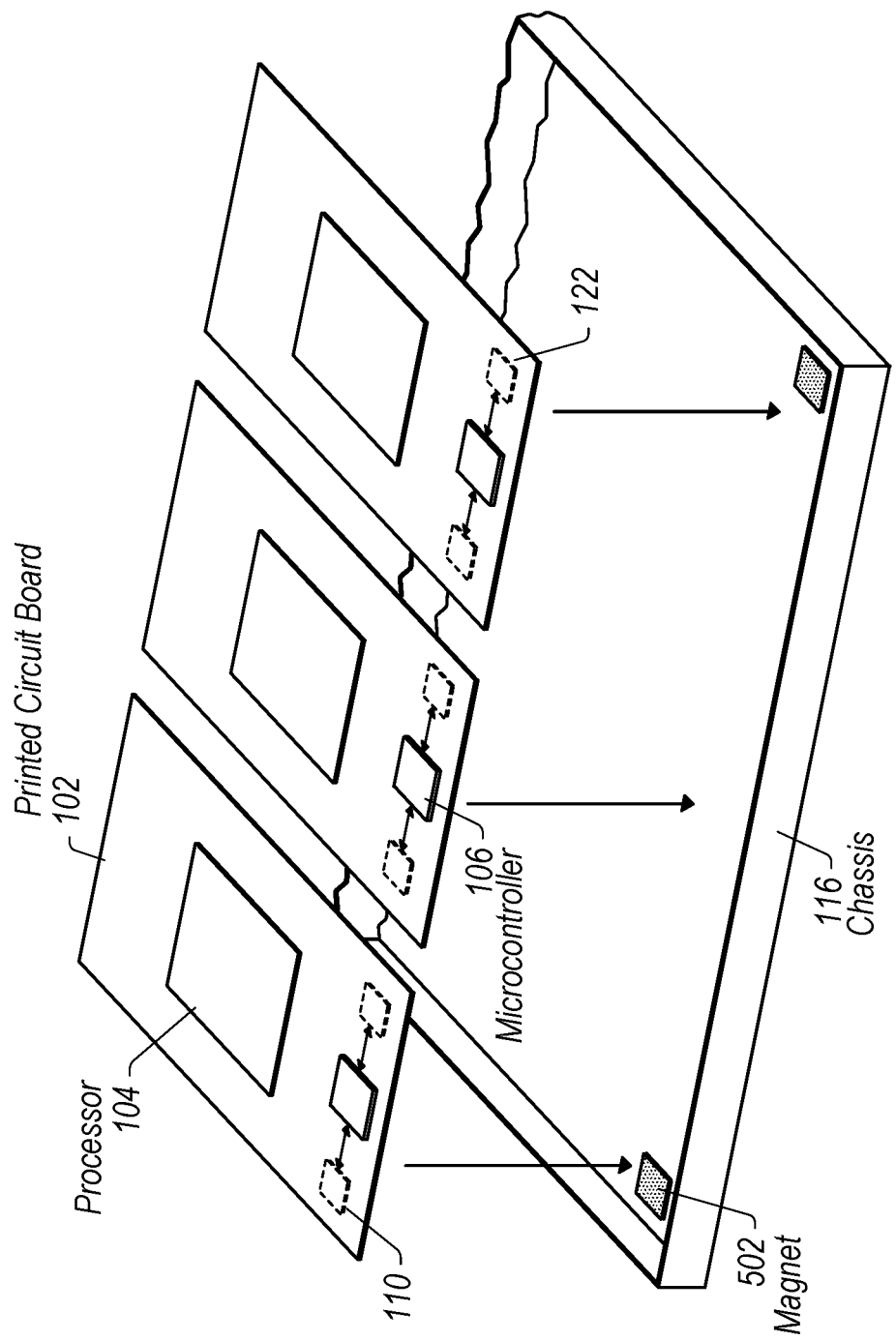
FIG. 5 is an exploded view of a cut away portion of an interior of a computing system chassis illustrating printed circuit boards being installed in the chassis at different mounting locations, wherein the different mounting locations comprise magnets coupled to the chassis that interface with pads of the printed circuit boards to indicate respective physical placement locations of the respective printed circuit boards when mounted in the chassis, according to some embodiments.
Figure 6:
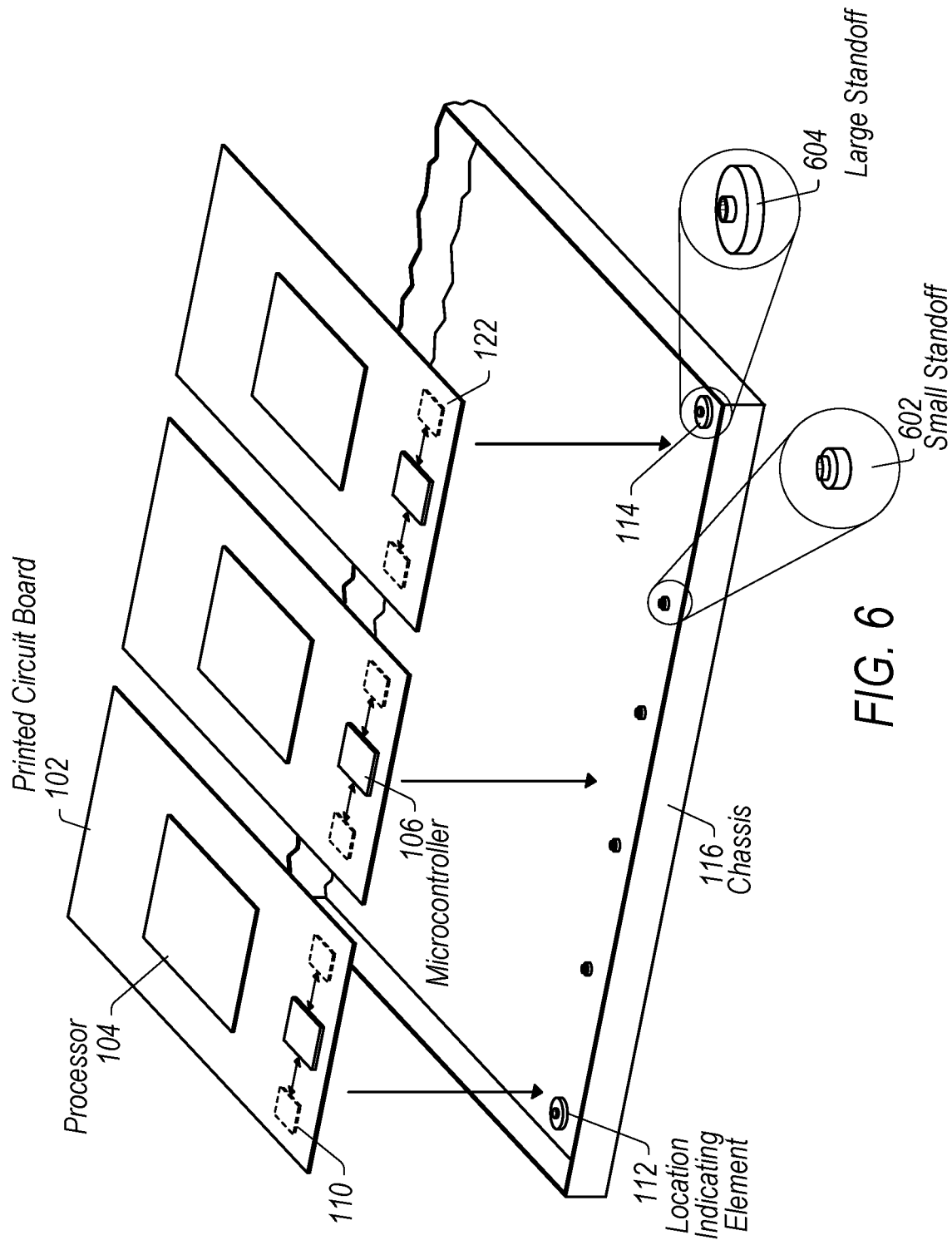
FIG. 6 is an exploded view of a cut away portion of an interior of a computing system chassis illustrating printed circuit boards being installed in the chassis at different mounting locations, wherein the different mounting locations comprise large and small standoffs coupled to the chassis that interface with pads of the printed circuit boards to indicate respective physical placement locations of the respective printed circuit boards when mounted in the chassis, according to some embodiments.
Figure 7:
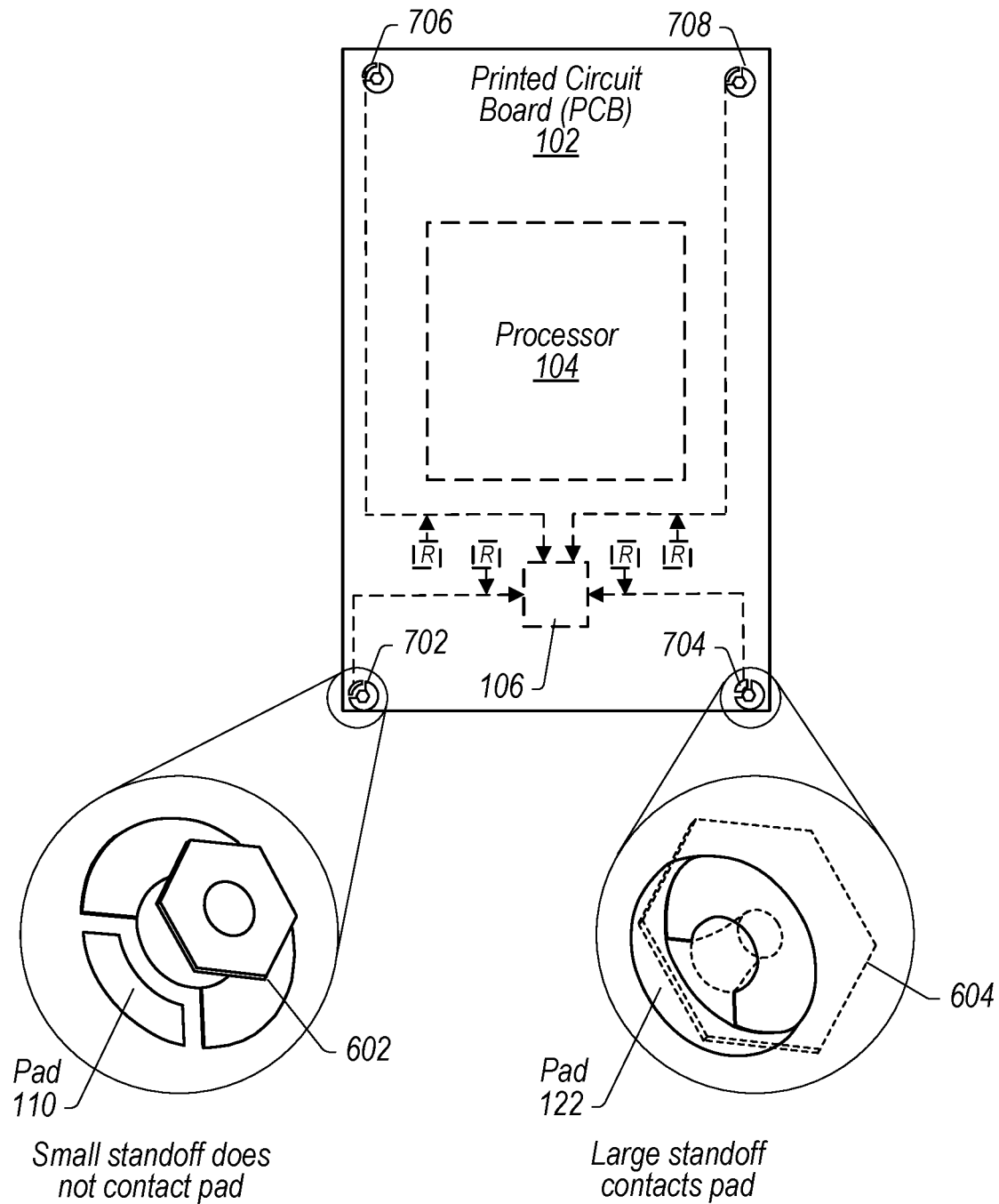
FIG. 7 is a bottom view of the printed circuit board comprising pads configured to interface with large and small standoffs of a computer system chassis to determine the physical placement location of the printed circuit board in a computer system chassis, according to some embodiments.

As discussed in more detail herein, in some embodiments, location indicating elements 112 and 114 may be conductive springs, such as shown in FIG. 4, magnets, such as shown in FIG. 5, standoffs such as shown in FIGS. 6-7, or other types of location indicating elements that can be detected by a sensing pad of a printed circuit board. Also, in some embodiments, the left and right side pads (110 and 122) of the printed circuit boards 102, 118, and 120 may be pads coupled to microcontroller 106 and configured to detect a ground connection, or may be magnetic sensors coupled to microcontroller 106 configured to detect a magnetic field, or other indicator associated with a location indicating element. Also as described herein, printed circuit boards 102, 118, and 120 may include more or fewer pads, which may be located in various locations on a bottom surface of the printed circuit boards, wherein the locations align with location indicating elements laid out in a pattern on a bottom panel of a chassis such that the location elements when interfacing with the pads of the printed circuit boards indicate the various placement locations of the printed circuit boards in the chassis.

In some embodiments, pads 110 and 122 may be pressure switches, wherein a pressure switch indicates a presence of a large standoff that contacts the pressure switch, and also indicates the lack of a large standoff (e.g. presence of a small standoff) when the pressure switch is not contacted by a large standoff (e.g. the small standoff does not have a width that contacts the pressure switch).

Figure 2A:
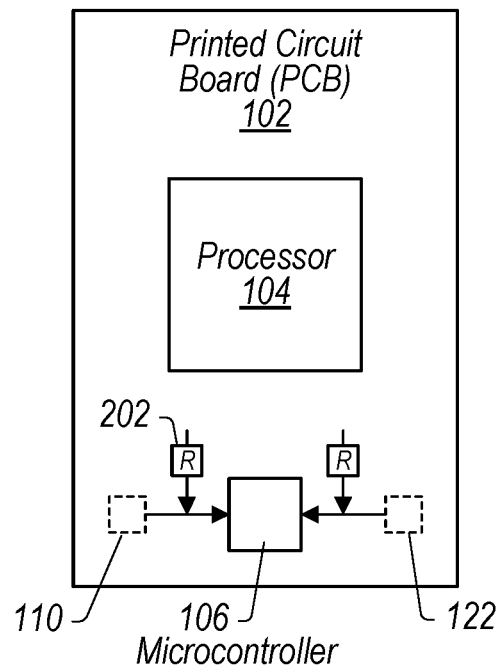
FIG. 2A is a top view of a printed circuit board comprising pads configured to interface with location indicating elements of a computer system chassis to determine a physical placement location of the printed circuit board in the computer system chassis, according to some embodiments.
Figure 2B:
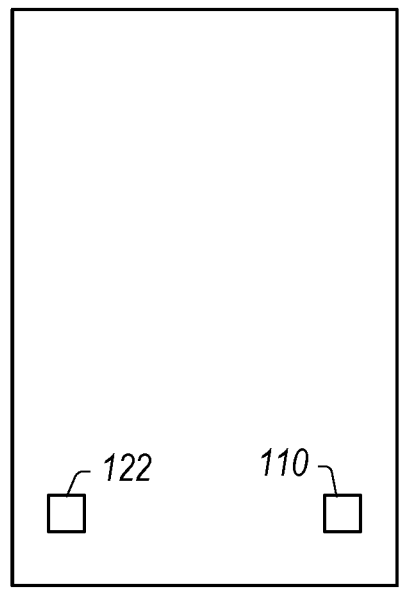
FIG. 2B is a bottom view of the printed circuit board comprising pads configured to interface with the location indicating elements of the computer system chassis to determine the physical placement location of the printed circuit board in the computer system chassis, according to some embodiments.

FIG. 2A is a top view of a printed circuit board comprising pads configured to interface with location indicating elements of a computer system chassis to determine a physical placement location of the printed circuit board in the computer system chassis, according to some embodiments. FIG. 2B is a bottom view of the printed circuit board comprising pads configured to interface with the location indicating elements of the computer system chassis to determine the physical placement location of the printed circuit board in the computer system chassis, according to some embodiments.

In some embodiments, a printed circuit board, such as printed circuit board 102 (or 118 or 120) includes resistors 202 coupled at a first end to a voltage source and coupled at a second end to a line connecting the respective pads 110 and 122 to the microcontroller 106. The voltage source may supply a slight voltage (e.g. ~3 volts) to the lines connecting the pad 110 or the pad 122 to the microcontroller 106. If a given pad 110 or 122 is connected to ground via a corresponding location indicating element 112 or 114 interfacing with the pad 110 or 122, the microcontroller will sense a ground connection at the line connected to the given pad 110 or 122. Also, if a given pad 110 or 122 is not connected to ground because it does not align with a location indicating element 112 or 114, the microcontroller 106 will sense the slight voltage (e.g. ~3 volts). This can be interpreted by the microcontroller 106 as a lack or absence of a ground connection. The microcontroller may then output a signal comprising a combination of sensed states for the pads 110 and 122, wherein a detected ground connection is signaled using a first value (e.g. 0) and an absence of a ground connection is signaled using a second value (e.g. 1). For example, if the left pad 110 is connected to ground and the right pad 122 is not connected to ground, the microcontroller may output a signal of 01. In some embodiments, ground could be signaled as 1 and no-ground connection signaled as 0. Also, in some embodiments, the microcontroller 106 may determine a placement location of the printed circuit board 102 based on the sensed pad states and may output information indicating the placement location in addition to or instead of the signal indicating the combination of sensed pad states.

Figure 3A:
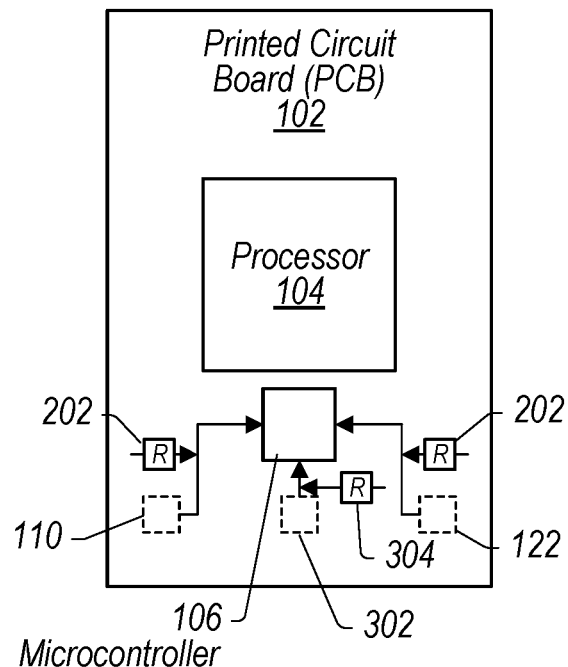
FIGS. 3A and 3B are top and bottom views of another printed circuit board comprising pads configured to interface with location indicating elements of a computer system chassis to determine a physical placement location of the other printed circuit board in the computer system chassis, according to some embodiments.
Figure 3B:
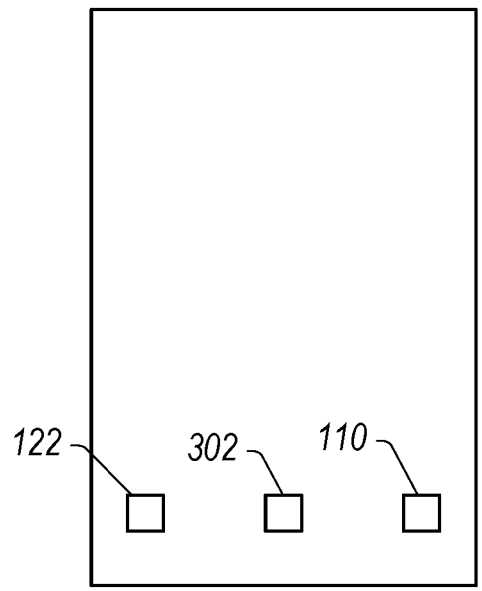

FIGS. 3A and 3B are top and bottom views of another printed circuit board comprising pads configured to interface with location indicating elements of a computer system chassis to determine a physical placement location of the other printed circuit board in the computer system chassis, according to some embodiments.

In some embodiments, a printed circuit board, such as any of printed circuit boards 102, 118, or 120 may include an additional third (or more) pad. For example, in FIGS. 3A and 3B printed circuit board 102 is illustrated with an additional pad 302 and resistor 304. The additional pad 302 and resistor 304 may function in a similar manner as pads 110 and 122 and resistors 202 as described in FIGS. 2A and 2B. However, the third pad 302 may be located in a different location on the printed circuit board 102 such that the additional pad 302 is configured to interface with location indicating elements in different locations of a chassis, such as chassis 116. For example, chassis 116 may include an additional location indicating element that aligns with center pad 302 when printed circuit board 102 is positioned in a particular mounting location in the chassis 116. For example, in some embodiments, a center pad 302 may be used to indicate additional placement locations, such as more than three locations across a row, or more than one row.

Further note that the locations of the pads as left, right and center described in FIGS. 2-3 are given solely as examples. In some embodiments various other pad locations may be used, wherein pads located in the other pad locations are configured to align with location indicating elements in a chassis located at locations in the chassis that align with the pads when the pads are installed in various ones of a plurality of available mounting locations in the chassis.

FIG. 4 is an exploded view of a cut away portion of an interior of a computing system chassis illustrating printed circuit boards being installed in the chassis at different mounting locations, wherein the different mounting locations comprise conductive spring elements coupled to the chassis that interface with pads of the printed circuit boards to indicate respective physical placement locations of the respective printed circuit boards when mounted in the chassis, according to some embodiments.

As discussed above, in some embodiments, location indicating elements 112 and 114 may be conductive spring elements, such as springs 402. The conductive spring elements may be coupled to a frame of the chassis 116. The frame of chassis 116 may be coupled to ground and the conductive spring elements may be coupled to ground via the fame, such as via chassis 116. When pads 110 or 122 contact the conductive spring element, such as spring 402, the pads may further be coupled to ground, thus indicating a ground connection to microcontroller 106.

The springs 402 shown in FIG. 4 are cantilevered conductive spring strips. However, in some embodiments various other spring types may be used, wherein the springs are made of a conductive material, such as copper, brass, etc.

FIG. 5 is an exploded view of a cut away portion of an interior of a computing system chassis illustrating printed circuit boards being installed in the chassis at different mounting locations, wherein the different mounting locations comprise magnets coupled to the chassis that interface with pads of the printed circuit boards to indicate respective physical placement locations of the respective printed circuit boards when mounted in the chassis, according to some embodiments.

In some embodiments, magnets and magnetic field sensors may be used to indicate mounting locations in a chassis. For example, as shown in FIG. 5, location indicating elements 112 and 114 may be magnets 502 and pads 110 and 122 may be magnetic field sensors. The use of magnets and magnetic field sensors may allow for physical placement location verification without actual contact between the location indicating elements and the printed circuit boards, which may provide advantages in some applications.

FIG. 6 is an exploded view of a cut away portion of an interior of a computing system chassis illustrating printed circuit boards being installed in the chassis at different mounting locations, wherein the different mounting locations comprise large and small standoffs coupled to the chassis that interface with pads of the printed circuit boards to indicate respective physical placement locations of the respective printed circuit boards when mounted in the chassis, according to some embodiments.

In some embodiments, small and large standoffs and pads configured to couple (or not couple) with the small and large standoffs may be used to indicate mounting locations in a chassis. For example, as shown in FIG. 6, location indicating elements 112 and 114 may be large standoffs 604. Also, pads 110 and 122 may be configured to create a ground connection with large standoffs 604, but not create a ground connection when coupled with small standoffs 602. In some embodiments, a large standoff may include a shorter height upper cylinder that has a shorter height than an upper cylinder of a small standoff. Also, the large standoff may include a larger diameter lower cylinder and corresponding interface area that is wider than a lower cylinder of a small standoff. The larger area interface may make contact with a pad portion of a mounting element of printed circuit board 102, but the pad portion of printed circuit board 102 may be located beyond the outer diameter of the lower cylinder portion of the small standoff 602 when mounted on a small standoff.

FIG. 7 is a bottom view of the printed circuit board comprising pads configured to interface with large and small standoffs of a computer system chassis to determine the physical placement location of the printed circuit board in a computer system chassis, according to some embodiments.

In some embodiments, a printed circuit board, such as printed circuit board 102, may include mounting elements comprising pad portions in each corner of the printed circuit board. For example, printed circuit board 102 illustrated in FIG. 7 includes mounting elements 702, 704, 706, and 708, each comprising a pad portion, such as pad portions 110 and 122. In some embodiments, including pad portions in each corner of the printed circuit board may enable a larger number of possible placement locations to be signaled and/or may enable redundancies, such that a failed pad does not result in an incorrect placement identification for the printed circuit board.

FIG. 7 further illustrates enlarged detailed views of the pads and mounting elements of the printed circuit board 102 interfacing (e.g. connecting) with the standoff to form a ground connection with the pad (e.g. as shown for pad 122 coupled to large standoff 604) or interfacing with the small standoff 602 such that pad 110 does not form a ground connection.

Figure 8:
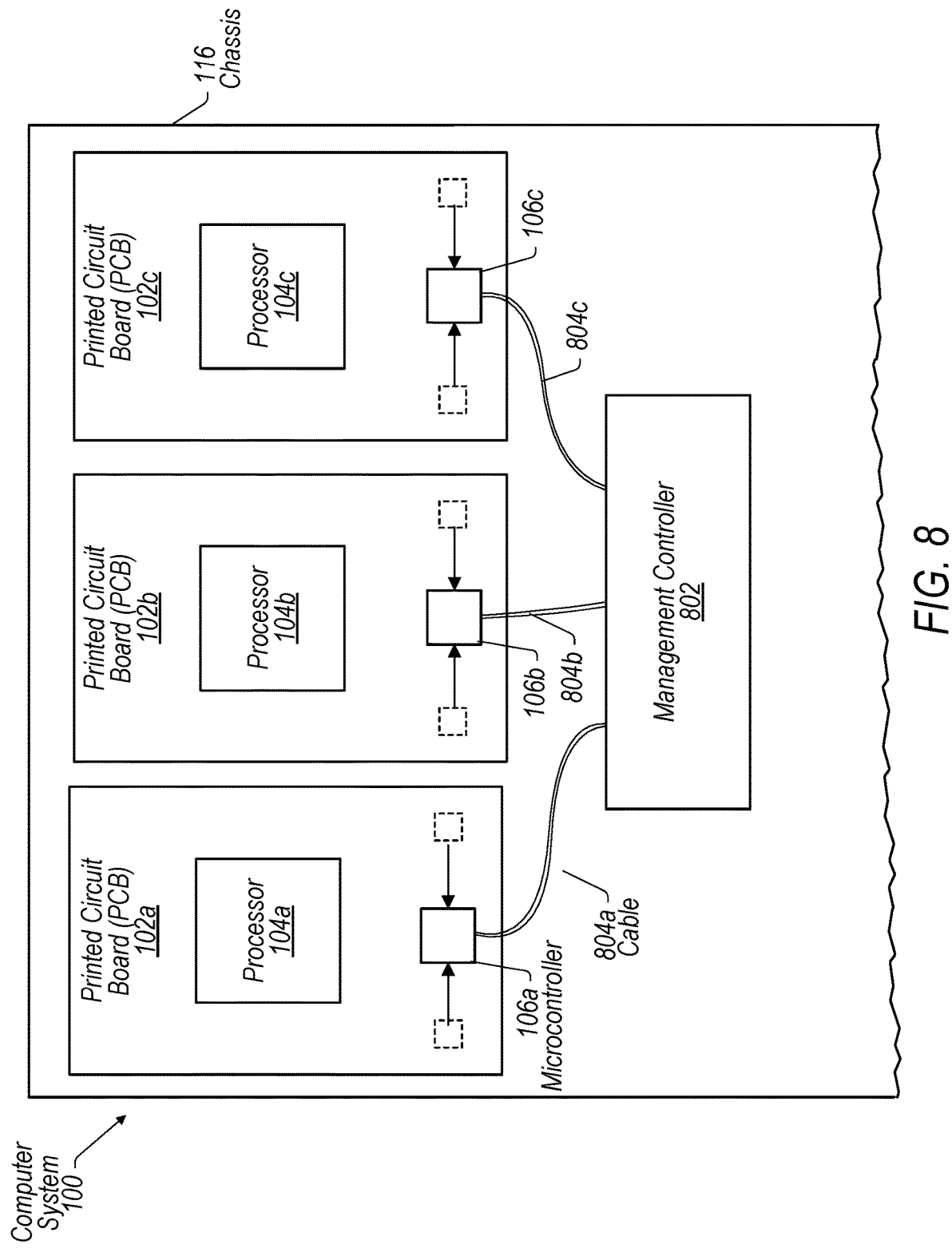
FIG. 8 is a schematic diagram illustrating a plurality of printed circuit boards mounted in a computer system chassis coupled to ports of a management controller via cables, according to some embodiments.

FIG. 8 is a schematic diagram illustrating a plurality of printed circuit boards mounted in a computer system chassis coupled to ports of a management controller via cables, according to some embodiments.

In some embodiments, computer system 100 further includes a management controller 802, wherein the respective printed circuit boards (e.g. PCBs 102a through 102c) are coupled to the management controller 802 via cables 804a through 804c. The microcontrollers of the respective printed circuit boards (e.g. microcontrollers 106a through 106c) may signal the combinations of detected pad states to the management controller 802 (or may directly indicate the determined mounting location of a given printed circuit board comprising the microcontroller to the management controller).

The management controller may be configured to determine processing roles or tasks to assign to the processors 104 of the printed circuit boards 102 based on the respective physical locations of the printed circuit boards in the chassis 116. As mentioned above, miss-matching of the cables 804 will not lead to an incorrect position location being communicated to the management controller 802. For example, if printed circuit board 102b located in the center mounting location where to have its cable connection to the management controller 802 switched with the cable from printed circuit board 102a mounted in the left mounting location. The ID (such as PCIe ID) assigned to the printed circuit board 102b would still be associated with the center location, because printed circuit board 102b independently verifies its placement location via pads 110 and 122 and microcontroller 106b, without relying on cable 804b to be connected to a particular port of management controller 802 to determine its location. For example, printed circuit board 102b will communicate to management controller 802 that it is located in the center mounting location regardless of its cable connection to management controller 802. Thus, even if printed circuit board 102b were connected to a left most port of management controller 802, the management controller would still associate the printed circuit board 102b connected to the left most port of the management controller 802 with the center mounting location. This is because printed circuit board 102b independently verifies its physical placement location via the pads interfacing with location indicating elements of the chassis and communicates this information back to the management controller 802.

In some embodiments, the management controller 802 is configured to issue one or more status reports for the printed circuit boards 102a, 102b, and 102c. The status report indicates respective statuses of the boards (e.g. failed not-failed, as an example) and respective locations of the boards having the indicated status. For example, if printed circuit board 102b were to fail, the management controller 802 may issue a status report indicating center board failed.

Figure 9:
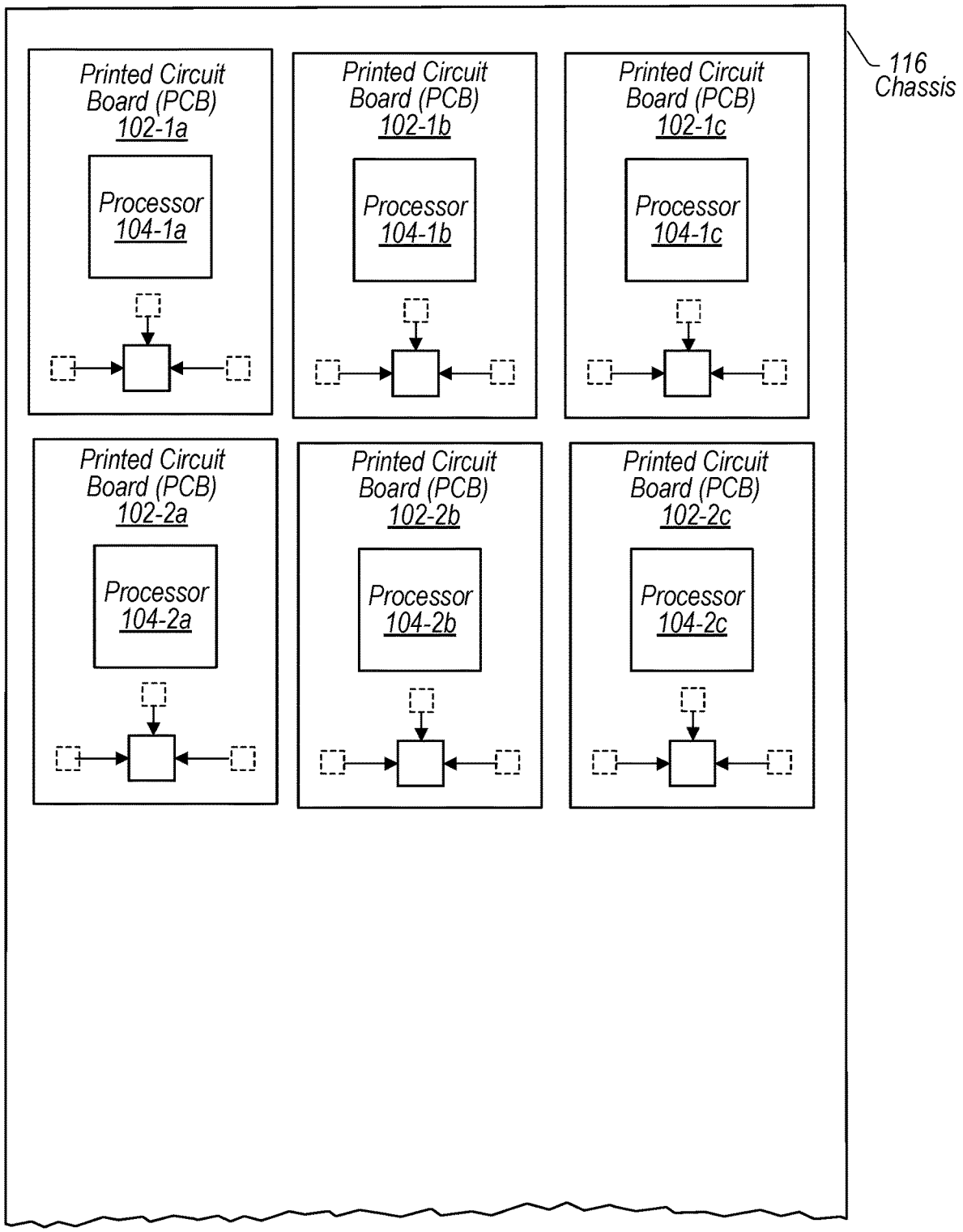
FIG. 9 is a schematic diagram of a partial portion of a chassis interior comprising multiple rows of printed circuit boards, wherein pads of the respective printed circuit boards interface with location indicating elements coupled to the chassis, and wherein respective microcontrollers of the printed circuit boards indicate signals based on the detected presence or absence of location indicating elements via the pads of the printed circuit boards, wherein the signals indicate a row to which the printed circuit boards belong and locations of the printed circuit boards in the rows, according to some embodiments.

FIG. 9 is a schematic diagram of a partial portion of a chassis interior comprising multiple rows of printed circuit boards, wherein pads of the respective printed circuit boards interface with location indicating elements coupled to the chassis, and wherein respective microcontrollers of the printed circuit boards indicate signals based on the detected presence or absence of location indicating elements via the pads of the printed circuit boards, wherein the signals indicate a row to which the printed circuit boards belong and locations of the printed circuit boards in the rows, according to some embodiments.

In some embodiments, printed circuit boards 102 may be mounted in a chassis 116 in multiple rows and columns (or other configurations), wherein pads of the printed circuit boards detect a presence or absence of a location indicating element adjacent to the pad. In such embodiments, various sensed combinations of sensed or not sensed location indicating elements at the respective pads may be used to signal locations of the printed circuit boards in the rows and columns (or other configurations).

Figure 10:
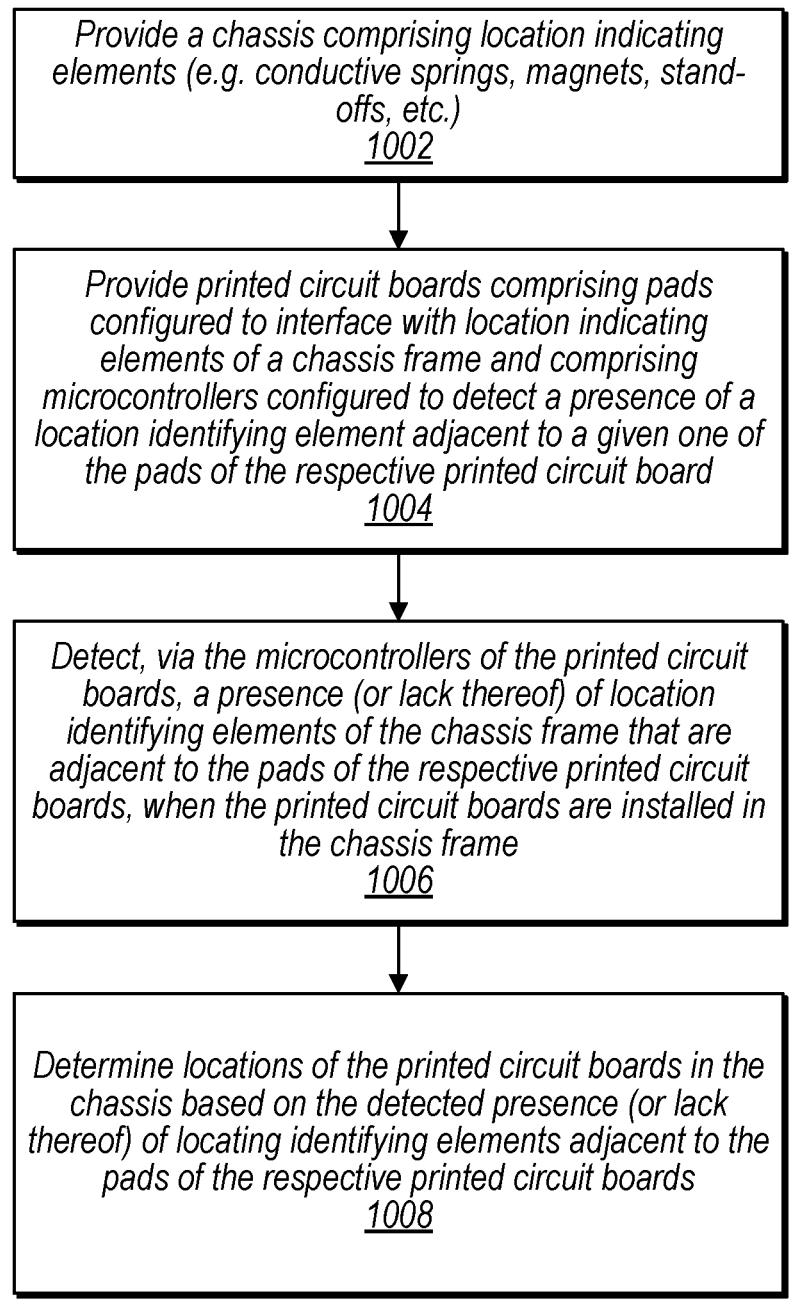
FIG. 10 is a flow chart illustrating a process for providing a computer system that implements physical placement verification of printed circuit boards and using location indicating elements and pads of the printed circuit board to determine locations of the printed circuit boards in the chassis, according to some embodiments.

FIG. 10 is a flow chart illustrating a process for providing a computer system that implements physical placement verification of printed circuit boards and using location indicating elements and pads of the printed circuit board to determine locations of the printed circuit boards in the chassis, according to some embodiments.

At 1002, a chassis is provided comprising location indicating elements (e.g. conductive springs, magnets, standoffs, etc.). At 1004, printed circuit boards are provided comprising pads configured to interface with location indicating elements of a chassis frame and comprising microcontrollers configured to detect a presence (or an absence) of a location identifying element adjacent to a given one of the pads of the respective printed circuit board.

At 1006, microcontrollers of the respective printed circuit boards detect a presence (or lack thereof) of location identifying elements of the chassis frame that are adjacent to the pads of the respective printed circuit boards, when the printed circuit boards are installed in the chassis frame.

At 1008, the microcontrollers of the respective printed circuit boards determine locations of the printed circuit boards in the chassis based on the detected presence (or lack thereof) of locating identifying elements adjacent to the pads of the respective printed circuit boards. For example, the microcontroller may create a map between a logical ID (e.g. PCIe ID, SMbus-Address, etc.) and an actual location in the chassis (e.g. a slot ID of a slot in the chassis). This may be especially useful when a server comprising the chassis uses flexible connectivity (e.g. PCIe cables) to connect the printed circuit boards to the microcontroller.

Figure 11:
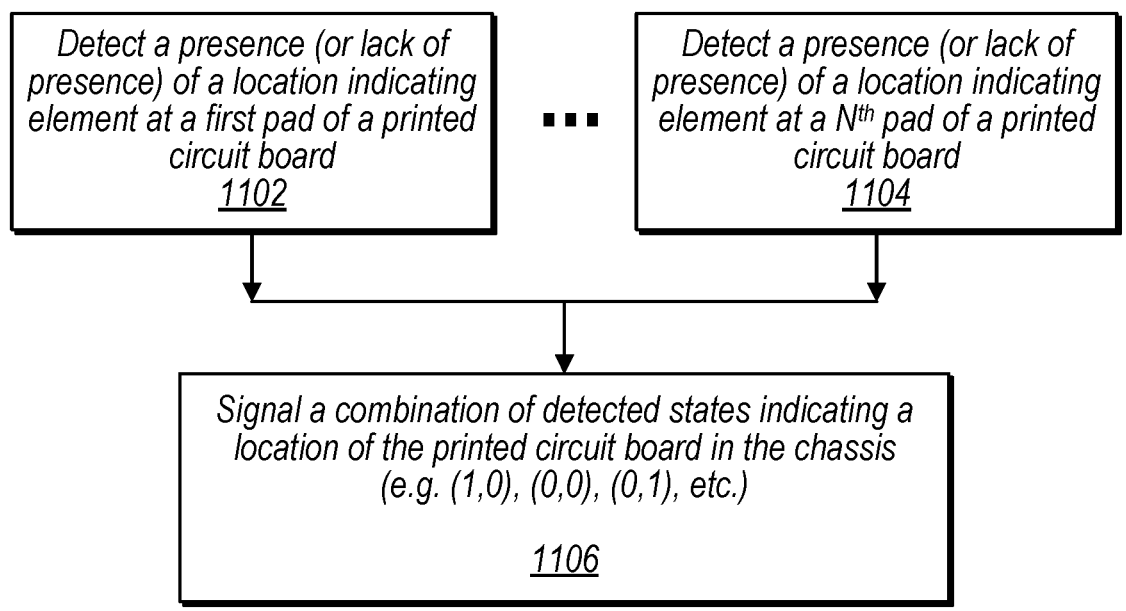
FIG. 11 is a flow chart illustrating a process for signaling a physically verified placement location for a printed circuit board in a computer system chassis, according to some embodiments.

FIG. 11 is a flow chart illustrating a process for signaling a physically verified placement location for a printed circuit board in a computer system chassis, according to some embodiments.

At 1102 through 1104, a microcontroller of a printed circuit board detects a presence (or lack of presence) of a location indicating element at a first pad of a printed circuit board and at one or more additional pads of the printed circuit board.

At 1106, the microcontroller of the printed circuit board signals a combination of detected pad states indicating a location of the printed circuit board in the chassis (e.g. (1,0), (0,0), (0,1), etc.).

Figure 12:
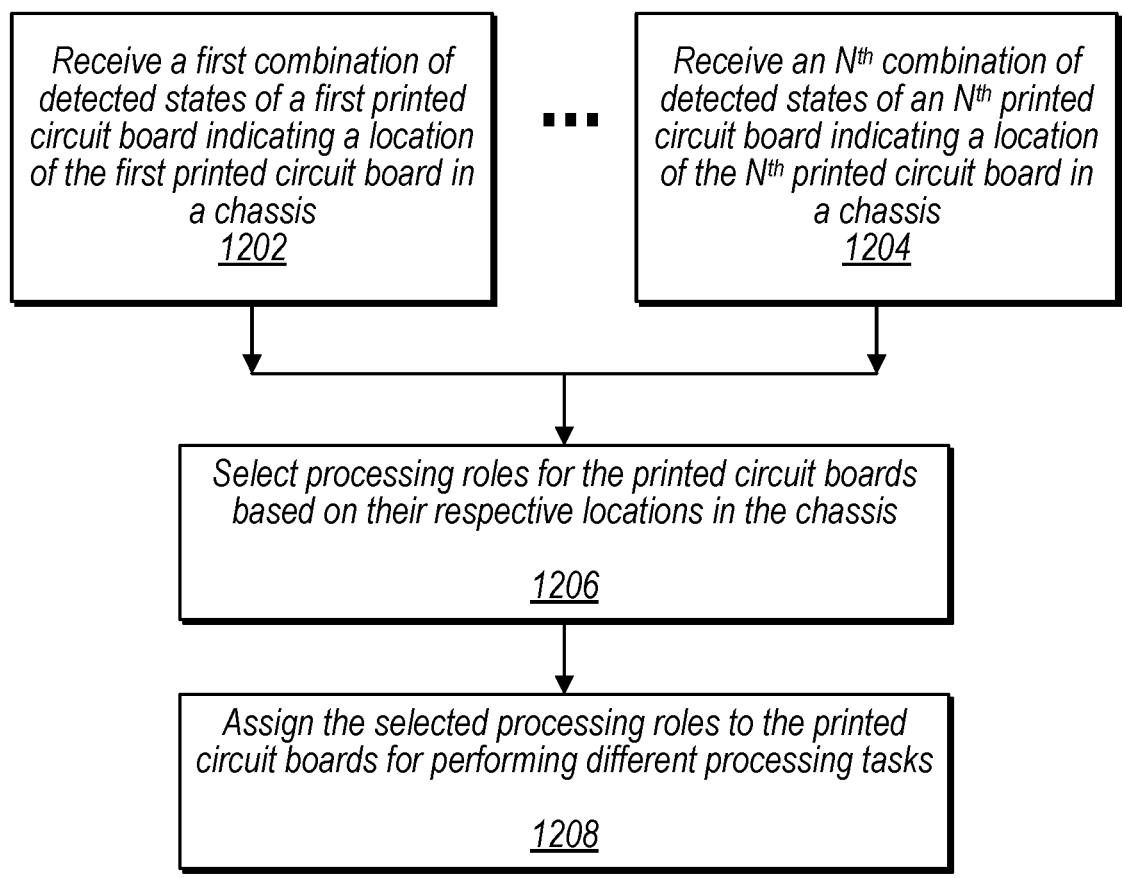
FIG. 12 is a flow chart illustrating a process for assigning roles or tasks to printed circuit boards based on physically verified placement locations, according to some embodiments.

FIG. 12 is a flow chart illustrating a process for assigning roles or tasks to printed circuit boards based on physically verified placement locations, according to some embodiments.

At 1202, a management controller (such as management controller 802 illustrated in FIG. 8) of a computer system comprising the printed circuit boards receives a first combination of detected states of a first printed circuit board indicating a location of the first printed circuit board in a chassis, and at 1024 receives up to an Nth combination of detected states of up to an Nth printed circuit board indicating locations of the up to N printed circuit boards in a chassis.

At 1206, the management controller of the computer system selects processing roles for the printed circuit boards based on their respective locations in the chassis. For example, the functionality to be assigned to a given printed circuit board may be tied to the printed circuit board's physical location in the chassis. For example certain locations may be more proximate to other components in a rack, such as a top of rack (TOR) switch. Thus a printed circuit board in a particular location may be assigned a role of network card or virtualization card. Also as discussed above, processing roles or tasks may be assigned taking into account physical locations of printed circuit boards to improve or optimize heat transfer and/or heat rejection in the chassis of the computing system. In some embodiments, processing roles or tasks may be assigned taking into account physical locations of the printed circuit boards in the chassis for other reasons.

At 1208, the management controller assigns the selected roles to the printed circuit boards for performing different processing tasks or roles.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
    providing a chassis comprising location indicating elements coupled to the chassis at different board mounting locations in the chassis, wherein the location indicating elements are arranged in different patterns for respective ones of the board mounting locations;
    providing a plurality of circuit boards, wherein respective ones of the circuit boards comprise pads on a surface of the respective circuit board, wherein the pads are configured to interface with the location indicating elements of the chassis arranged in the different patterns for the respective ones of the board mounting locations;
    detecting, via respective microcontrollers on the respective circuit boards, a presence, or an absence, of corresponding location indicating elements in the chassis adjacent to the respective pads of the respective circuit boards when the respective circuit boards are installed in the chassis; and
    determining respective locations of the respective circuit boards in the chassis based on respective detected patterns, wherein each of the respective detected patterns comprises a detection, or lack thereof, of corresponding location indicating elements, arranged in a given one of the different patterns, adjacent to the pads of the respective circuit boards.

2. The method of claim 1,
    wherein the location indicating elements coupled to the chassis comprise:
        large standoffs; and
        small standoffs,
    wherein said detecting via the respective microcontrollers on the respective circuit boards, the presence, or the absence, of the corresponding location indicating elements comprises:
        detecting a ground connection at a location in the chassis where one of large standoffs is located, wherein the one of large standoffs contacts a given pad of the pads of the respective circuit board to form the ground connection; or
        detecting a lack of a ground connection at another location in the chassis, where one of the small standoffs is located, wherein the one of the small standoffs does not form the ground connection at the other location in the chassis with the pad of the respective circuit board.

3. The method of claim 1,
    wherein the location indicating elements coupled to the chassis comprise conductive spring elements; and
    wherein said detecting via the respective microcontrollers on the respective circuit boards, the presence, or the absence, of the corresponding location indicating elements comprises:
        detecting a ground connection via a respective conductive spring element located at a location in the chassis such that the conductive spring element contacts the pad of the respective circuit board to form a ground connection; or
        detecting a lack of a ground connection via the pad of the respective circuit board at a location in the chassis where a conductive spring element is not located.

4. The method of claim 1,
    wherein the location indicating elements coupled to the chassis comprise magnets; and
    wherein said detecting via the respective microcontrollers on the respective circuit boards, the presence, or the absence, of the corresponding location indicating elements comprises:
        detecting a magnetic field at a location in the chassis adjacent to the pad of the respective circuit board where a magnet is located; or
        detecting a lack of a magnetic field at a location in the chassis adjacent to the pad of the respective circuit board where a magnet is not located.

5. A system, comprising:
    a board configured to mount in a chassis in a given board mounting location of a plurality of board mounting locations in the chassis, wherein location indicating elements of the chassis are arranged in different patterns for respective ones of the plurality of board mounting locations;
    wherein the board comprises:
        pads on a bottom surface of the board configured to interface with the location indicating elements of the chassis when the board is mounted in respective ones of the plurality of board mounting locations in the chassis; and
        a microcontroller configured to:
            detect a pattern of the location indicating elements for a board mounting location, wherein the pattern comprises a presence, or an absence, of the corresponding location indicating elements in the chassis adjacent to the respective pads on the bottom surface of the board; and
            signal a pattern of detected states for the pads of the board, or a location of the board in the chassis determined based on the pattern of detected states for the pads of the board.

6. The system of claim 5, wherein the detected states for the pads comprise:
a detected state indicating a detected ground connection; or
an another detected state indicating a lack of the detected ground connection.

7. The system of claim 5, wherein the detected states for the pads comprise:
a detected state indicating a detected magnetic field; or
another detected state indicating a lack of h detected magnetic field.

8. The system of claim 5, wherein the chassis comprises the location indicating elements, and wherein the location indicating elements comprise:
a large standoff configured to contact a pad of the pads of the board to form a ground connection when the board is mounted in a given one of the plurality of board mounting locations where the large standoff is located; and
a small standoff configured to not form a ground connection with the pad of the board when the board is mounted in another given one of the plurality of board mounting locations where the small standoff is located.

9. The system of claim 8, wherein the plurality of board mounting locations comprise a left side mounting location, a center mounting location, and a right side mounting location, and
wherein the microcontroller is configured to:
signal a first combination of detected states for the pads of the board indicating the board is mounted in the left side mounting location;
signal a second combination of detected states for the pads of the board indicating the board is mounted in the center mounting location; and
signal a third combination of detected states for the pads of the board indicating the board is mounted in the right side mounting location.

10. The system of claim 8, wherein the plurality of board mounting locations comprise locations in different column and row positions in the chassis; and
wherein the microcontroller is configured to signal different combinations of detected states for the pads of the board to indicate:
a column position in the chassis for the board; and
a row position in the chassis for the board.

11. The system of claim 5, further comprising:
the chassis comprising the location indicating elements; and
a management controller mounted in the chassis;
wherein the board is connected to the management controller via a cable.

12. The system of claim 11, wherein the microcontroller on the board is configured to:
signal a detected state for a pad of the pads of the board, or the location of the board, to the management controller via the cable.

13. The system of claim 12, wherein the management controller is configured to:
assign a processing role to the board based on a location in the chassis of the board relative to one or more other boards mounted in the chassis.

14. The system of claim 13, wherein the management controller is configured to:
select respective processing roles to assign to the board and the one or more other boards based on:
respective amounts of waste heat generation associated with performing the respective processing roles; and
the respective locations of the board in the chassis relative to the one or more other boards with other assigned processing roles.

15. A system comprising:
a chassis frame comprising:
a plurality of board mounting locations; and
for each board mounting location:
a different combination of location indicating elements arranged in a different pattern; or
a different positioning of the location indicating elements relative to the board mounting location, wherein the location indicating elements are arranged in the different pattern,
wherein the location indicating elements are configured to:
interface with pads of a board installed in a respective one of the board mounting locations to indicate a pattern of the location indicating elements for the respective one of the board mounting locations, wherein the pattern comprises a presence, or an absence, of the corresponding location indicating elements in the chassis adjacent to the respective pads of the board.

16. The system of claim 15, wherein the location indicating elements comprise conductive spring elements coupled to the chassis.

17. The system of claim 15, wherein the location indicating elements comprise magnets coupled to the chassis.

18. The system of claim 15, wherein the location indicating elements comprise standoffs coupled to the chassis and configured to support the board mounted in the respective one of the board mounting locations, wherein the standoffs comprise:
a large standoff configured to contact a given pad of h board to form a ground connection when the board is mounted in a given one of the plurality of board mounting locations where the large standoff is located; and
a small standoff configured to not form a ground connection with a pad of the board when the board is mounted in another given one of the plurality of board mounting locations where the small standoff is located.

19. The system of claim 15, wherein one of the different a combinations of the location indicating elements for one of the board mounting locations includes an absence of location indicating elements for the one board mounting location.

20. The system of claim 15, further comprising:
a management controller, wherein the management controller is configured to:
issue a status report for respective ones of a plurality of boards mounted in the respective board mounting locations,
wherein the status report indicates for a given board:
a status of the given board; and
a location of the given board in the chassis.

* * * * *